United States Patent [19]
Okumura et al.

[11] Patent Number: 5,679,009
[45] Date of Patent: Oct. 21, 1997

[54] CONNECTOR FOR A PRINTED CIRCUIT BOARD

[75] Inventors: Hitoshi Okumura; Koichiro Tokuwa; Heiji Kuki, all of Yokkaichi, Japan

[73] Assignee: Sumitomo Wiring Systems, Ltd., Japan

[21] Appl. No.: 516,389

[22] Filed: Aug. 17, 1995

[30] Foreign Application Priority Data

Sep. 16, 1994 [JP] Japan .................. 6-248670

[51] Int. Cl.⁶ .................................. H01R 13/629
[52] U.S. Cl. .................................. 439/79; 439/573
[58] Field of Search .................. 439/79, 381, 573

[56] References Cited

U.S. PATENT DOCUMENTS

| | | | |
|---|---|---|---|
| 4,992,054 | 2/1991 | Cassan | 439/381 |
| 5,147,225 | 9/1992 | Kile et al. | 439/680 |
| 5,249,983 | 10/1993 | Hirai | 439/573 |
| 5,306,162 | 4/1994 | Armendariz | 439/67 |
| 5,496,184 | 3/1996 | Garrett et al. | 439/79 |

FOREIGN PATENT DOCUMENTS

| | | |
|---|---|---|
| 2921805 | 12/1979 | Germany . |
| 3032585 | 5/1982 | Germany . |
| 3430573 | 2/1986 | Germany . |
| 4179078 | 7/1995 | Japan . |

*Primary Examiner*—Gary F. Paumen
*Attorney, Agent, or Firm*—Jordan B. Bierman; Bierman, Muserlian and Lucas LLP

[57] ABSTRACT

A connector for a printed circuit board which minimizes the deformation of the positioning member for aligning terminals. The engaging members are located at the outside of guide surfaces formed on the outer surfaces of the housing of the connector. The spacing between the engaging members is longer than if they were located inwardly of the guide walls projecting from the front surface of the housing. Accordingly, the deformation per unit length of the positioning member is small. Such a small deformation of the positioning member minimizes the misalignment of the holes into which the terminals are to enter. Thus, the terminals can be aligned with great accuracy.

18 Claims, 9 Drawing Sheets

CONNECTOR FOR A PRINTED CIRCUIT BOARD

This Application claims the priority of Japanese Application 6/248670, filed Sep. 16, 1994.

The present Invention relates to a connector to be connected to a printed circuit board.

BACKGROUND OF THE INVENTION

Connectors of the type to which the present Invention is directed are electrically connected to printed circuit boards by inserting leading ends of a plurality of terminals into through holes in the circuit board. However, it is difficult to insert the terminals into the through holes in the circuit board if the leading ends of the terminals face in different directions. In view of this, a connector provided with a positioning member for aligning the leading ends of such terminals has been used in recent years.

Figure 16A:
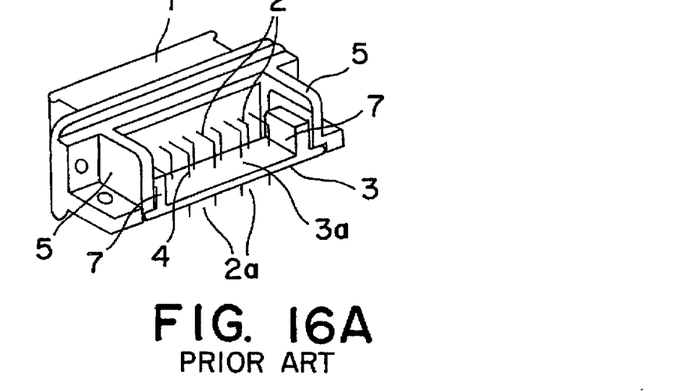
FIGS. 16(a), (b) and (c) are schematic representations of a prior art connector.
Figure 16B:
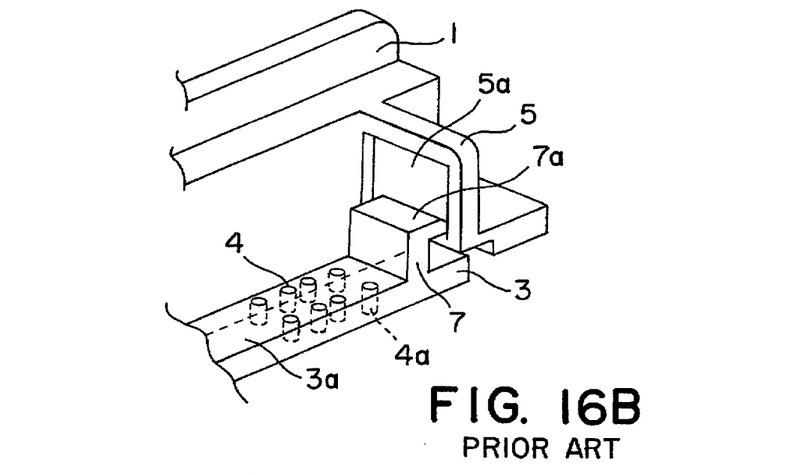
Figure 16C:
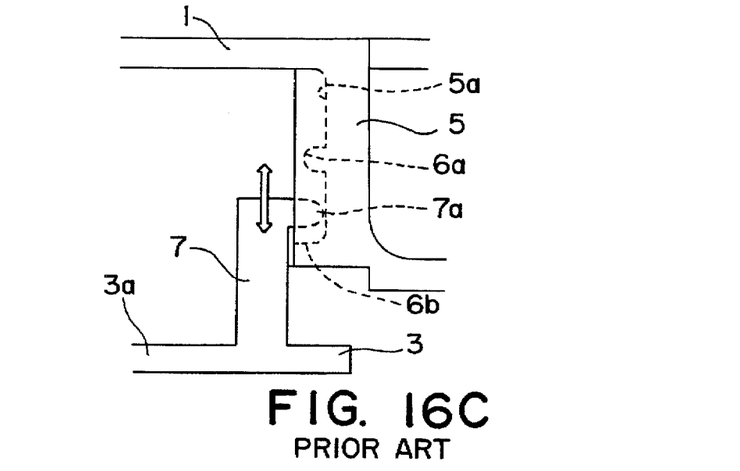

A connector of this type is disclosed in Japanese Unexamined Patent Publication No. 4-179078. The connector is shown in FIGS. 16(a) to 16(c), and includes housing 1 having a plurality of terminals 2 which project from housing 1 and are bent in an L-shape to extend downward. Positioning member 3, is provided with insertion holes 4 into which downwardly facing leading ends 2a of terminals 2 are insertable. A pair of guide walls 5, 5 is at opposite lateral sides of the front surface of housing 1 from which the lead terminals 2 project. On guide surfaces 5a, 5a, which are opposed to each other, there are formed locking projections 6a and 6b for retaining positioning member 3 in a locked position and a partially mounted position, respectively. On the other hand, a pair of wall-like engaging members 7, 7 stand upright at opposite lateral sides from plate-like main body 3a of positioning member 3 wherein insertion holes 4 are provided. Projection 7a, engageable with locking projections 6a and 6b, is located on the outer surface of each engaging member 7.

Positioning member 3 is mounted on housing 1 by fitting engaging members 7 against guide surfaces 5a from below, and is held in its partially mounted position when engaging projections 7a move over lower locking projections 6b. Leading ends 2a of terminals 2 are inserted a short distance into insertion holes 4 so that they can be positioned in conformity with unillustrated through holes in the printed circuit board. Further, since leading ends 2a of terminals 2 are protected within positioning member 3, they are kept free from damage caused by external forces.

To mount the connector on the printed circuit board, leading ends 2a of terminals 2 are caused to project downwardly from insertion holes 4 by moving positioning member 3 from its partially mounted position to its locked position. When the connector is mounted in a specified position on the printed circuit board, all leading ends 2a of terminals 2 positioned in insertion holes 4 are inserted into the through holes of the printed circuit board at the same time.

In the aforementioned prior art connector, when positioning member 3, mounted on housing 1, is moved to the partially mounted position, and then is moved from the partially mounted position to the locked position, engaging members 7 are inwardly deflected as engaging projections 7a move over partially mounted projections 6b and locking projections 6a of guide walls 5.

Upon being deflected, engaging members 7 themselves undergo an elastic deformation and also cause plate-like main body 3a of positioning member 3 to undergo elastic deformation. Insertion holes 4, formed in main body 3a as described above, are slightly deformed and disarranged as main body 3a is deflected. The deformation and the disarrangement of insertion holes 4 should be avoided to correctly align leading ends 2a of terminals 2 therewith.

SUMMARY OF THE INVENTION

In view of the above problem, it is an object of the Invention to minimize deformation of the positioning member when it is moved relative to the housing into the partially mounted position and the locked position.

As previously indicated, when the positioning member is mounted on the housing or moved between its partially mounted position and its locked position, the engaging members of the positioning member undergo inward elastic deformation away from the guide walls of the housing, because of the presence of the projections forming the retaining means. The elastic deformation of the engaging members causes deformation of the portion of the positioning member carrying the insertion holes.

In the present Invention, however, the engaging members are located at the outside of the guide surfaces formed on the outer surfaces of the housing. Accordingly, the distance between the engaging members is longer, compared to the prior art connector in which the engaging members are located on the inside of the inwardly facing guide surfaces on the housing. Thus, the misalignment of the insertion holes caused by deformation of the positioning member is kept to a minimum. Accordingly, the Invention is fairly free from adverse influences brought about by the deformation and the disarrangement of the insertion holes, thereby achieving highly accurate alignment.

In a preferred form of the Invention, the connector further comprises a securing device comprising at least one screw which is inserted from underneath the circuit board and threadedly engages the positioning member or the housing. Since the threads of the screw(s) inserted from underneath the circuit board engage the positioning member or the housing, the connector gradually comes closer to the circuit board as the screws are turned. Thus, the connector is securely mounted on the circuit board, and the leading ends of the terminals are inserted into the through holes of the printed circuit board to a sufficient depth.

According to a further preferred embodiment, the connector includes a positioning means, preferably in the form of recesses and complementary projections which are provided on the positioning member and the circuit board, to secure the positioning member in the desired position. Hence, the connector can be readily located on the circuit board where the terminals are in conformity and in register with the through holes of the circuit board; thus the connector can be readily positioned, permitting a ready and secure connection. Particularly if the retaining means is caused to retain the positioning member in its partially mounted position, the connector can be smoothly placed and fixed on the printed circuit board by the engaging means. If the positioning means is moved to its locked position, the terminals can be easily inserted into the through holes of the printed circuit board.

Preferably, there are inclined surfaces slanting toward the insertion holes, immediately adjacent thereto on the side from which the terminals are inserted. As a result, even if the leading ends of the terminals are displaced when the positioning member is mounted in its partially mounted position, they come into contact with the inclined surfaces and are guided toward the centers of the insertion holes along the slope thereof. Accordingly, even if the leading ends of the lead terminals are displaced from their optimum positions, inclined surfaces will guide them to the proper through holes. Thus, the insertion of the leading ends of the terminals can be smoothly carried out.

BRIEF DESCRIPTION OF THE DRAWINGS

In the accompanying drawings, constituting a part hereof, and in which like reference characters indicate like parts.

DESCRIPTION OF THE PREFERRED EMBODIMENT(S)

Figure 1:
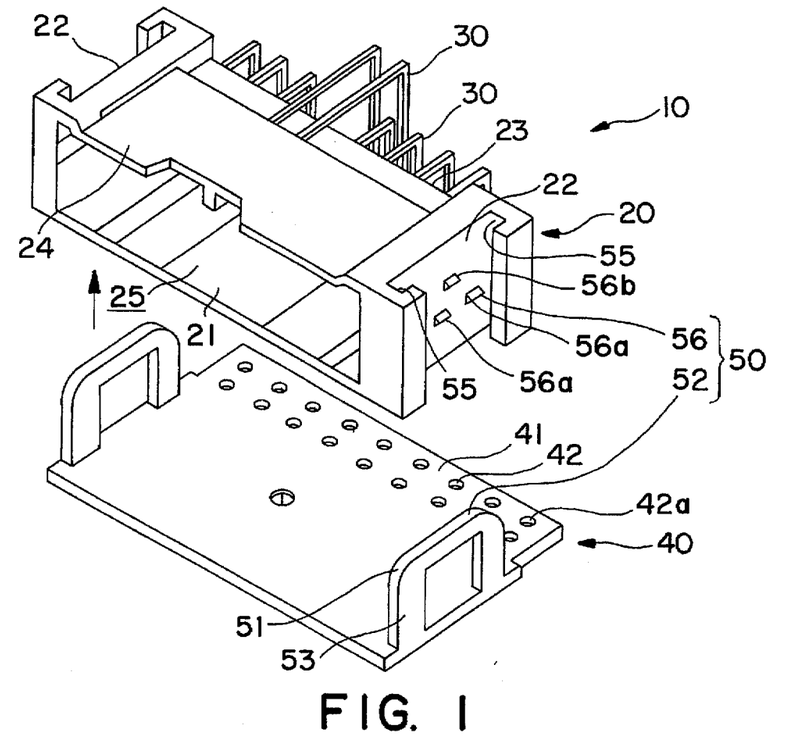
FIG. 1 is an exploded perspective view of a first embodiment of the connector of the present Invention.
Figure 2:
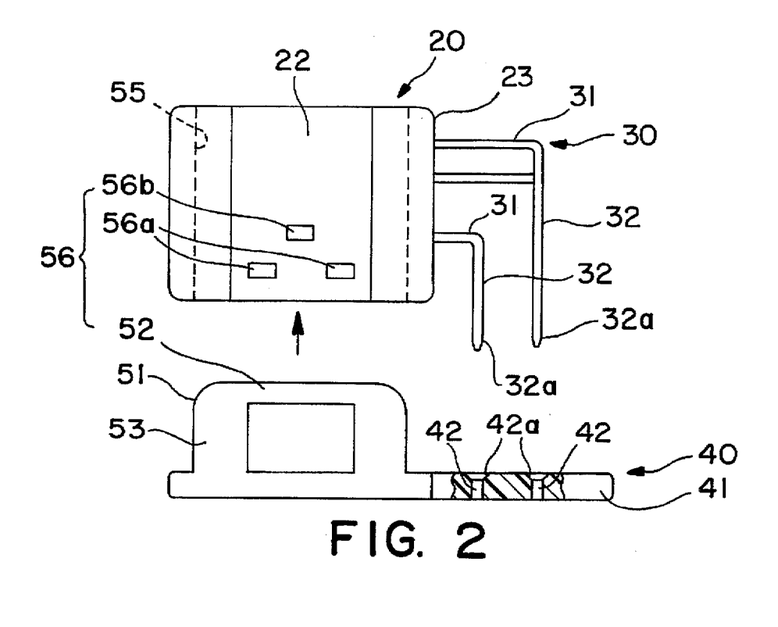
FIG. 2 is an exploded end view of the connector of FIG. 1.

In FIGS. 1 and 2, connector 10 includes housing 20, terminals 30, projecting from the rear surface (right side) of housing 20, and positioning member 40, which is detachably mountable on housing 20 and is provided with a plurality of insertion holes 42 corresponding to the plurality of terminals 30. Housing 20 is preferably unitarily formed of an insulating material in a box-like shape, and has a bottom 21, opposite side walls, rear wall 23, and top 24. Engaging opening 25, into which an unillustrated male connector is mounted, is at the front part of housing 20.

The side walls of housing 20 are parallel to each other, and the outer surfaces thereof constitute guide surfaces 22. Engaging members 51 of positioning member 40 are brought into contact with guide surfaces 22 and held there by their opposite lateral ends; thereby, positioning member 40 is permitted to have a parallel up-and-down movement without being displaced in the lateral direction. The plurality of terminals 30 is mounted so that they project from rear wall 23 of housing 20. Each terminal 30 is bent into an L-shape, and includes horizontal portion 31 secured on rear wall 23 and vertical portion 32 having leading end 32a facing downward.

Positioning member 40 consists of a substantially rectangular flat insulating plate of an elastically deformable synthetic resin. Narrow rear portion 41, carrying the plurality of insertion holes 42, is at the rear of positioning member 40.

Insertion holes 42, which correspond in number to the number of terminals 30, are in register with leading ends 32a of terminals 30. Leading ends 32a are inserted into the respective insertion holes 42 from above. On the upper edge of each insertion hole 42, there is inclined surface 42a which is adjacent insertion hole 42, substantially concentric therewith, and slanted toward hole 42.

Positioning member 40 is mounted on housing 20 by a pair of upwardly projecting engaging members 51, at the opposite lateral sides on the upper surface of positioning member 40. Engaging members 51 do not extend over rear portion 41. Each engaging member 51 includes engaging portion 52 and supports 53, and is formed in an inverted U-shape. The distance between the inner surfaces of engaging members 51 is equal to the distance between the outside of the side walls of housing 20. In other words, the outer surfaces of supports 53 can be brought into contact with guide surfaces 55.

Three projections 56, each preferably having a semicircular cross-section, project outward from the outside of each side wall of housing 20. Projections 56 and engaging portions 52 of engaging members 51 form retainer 50 for holding positioning member 40 in its partially mounted and locked positions on housing 20.

Figure 3:
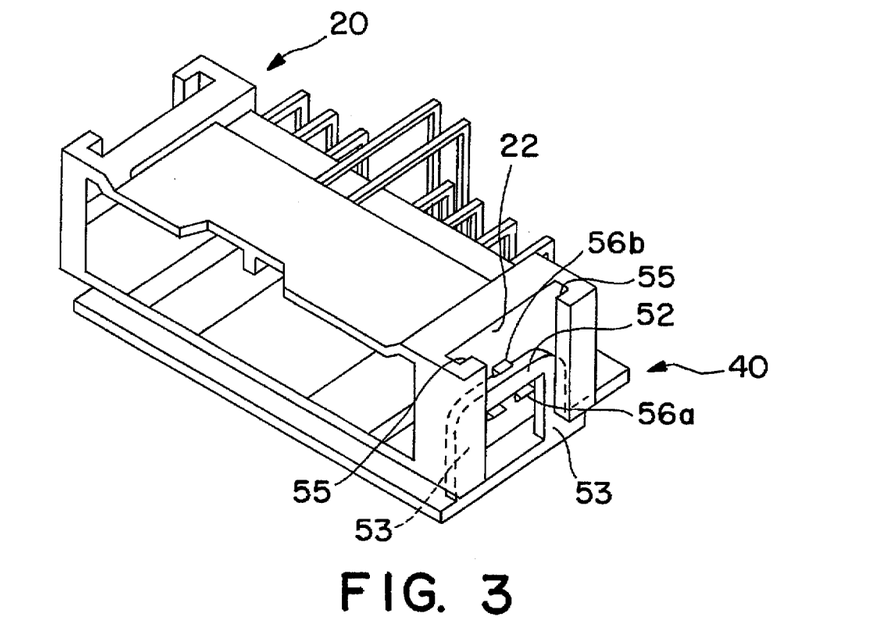
FIG. 3 is a perspective view of the connector of FIG. 1 in its partially mounted position.
Figure 4:
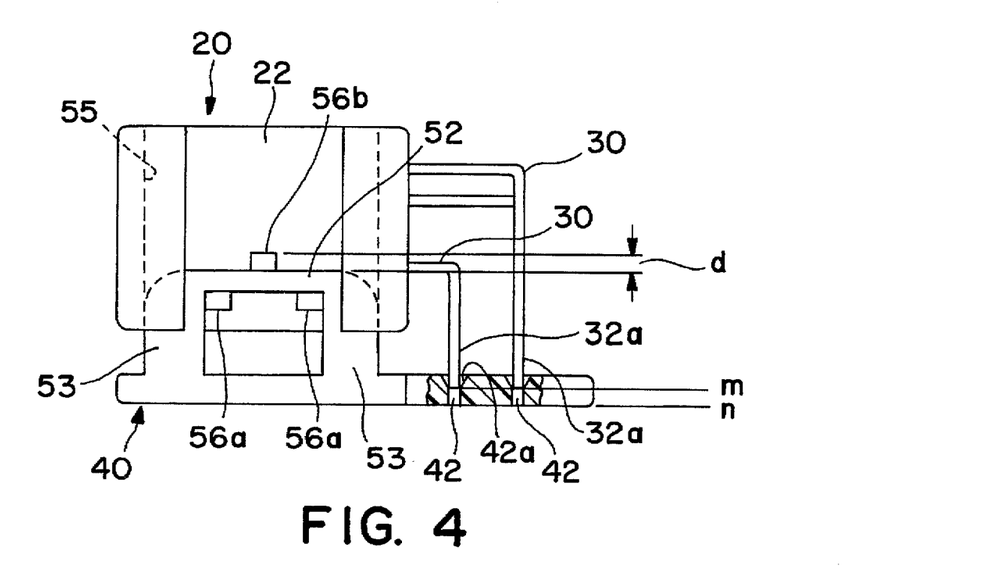
FIG. 4 is an end view of the connector of FIG. 3.

Partially mounted projections 56a are at the same level on the lower part of guide surfaces 22, and locked projection 56b is located above partially mounted projections 56a, spaced apart therefrom by a distance equal to the width of engaging portion 52. Accordingly, engaging portion 52 can be held between partially mounted projection 56a and locked projection 56b as shown in FIGS. 3 and 4. The level of partially mounted projections 56a is such that leading ends 32a of terminals 30 are inserted a short distance into insertion holes 42 when engaging portions 52 are mounted as described above. In other words, projections 56a are located so that positioning member 40 is held in its partially mounted position where leading ends 32a of vertical portions 32 of terminals 30 are inserted into holes 42 by a distance m, but do not extend beyond them.

Figure 5:
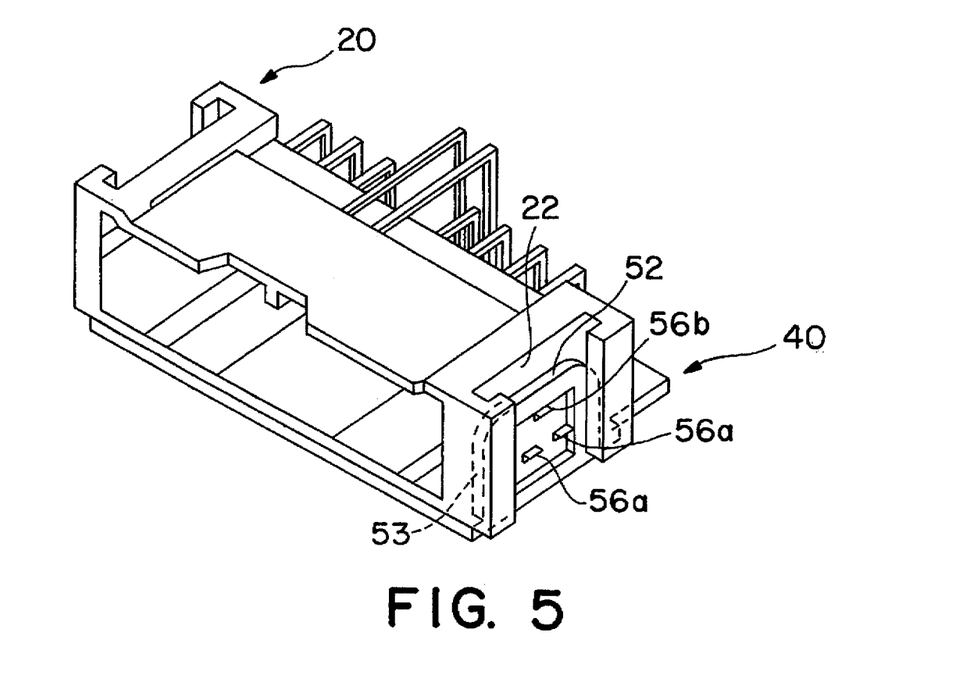
FIG. 5 is a perspective view of the connector of FIGS. 1 and 3, in its locked position.
Figure 6:
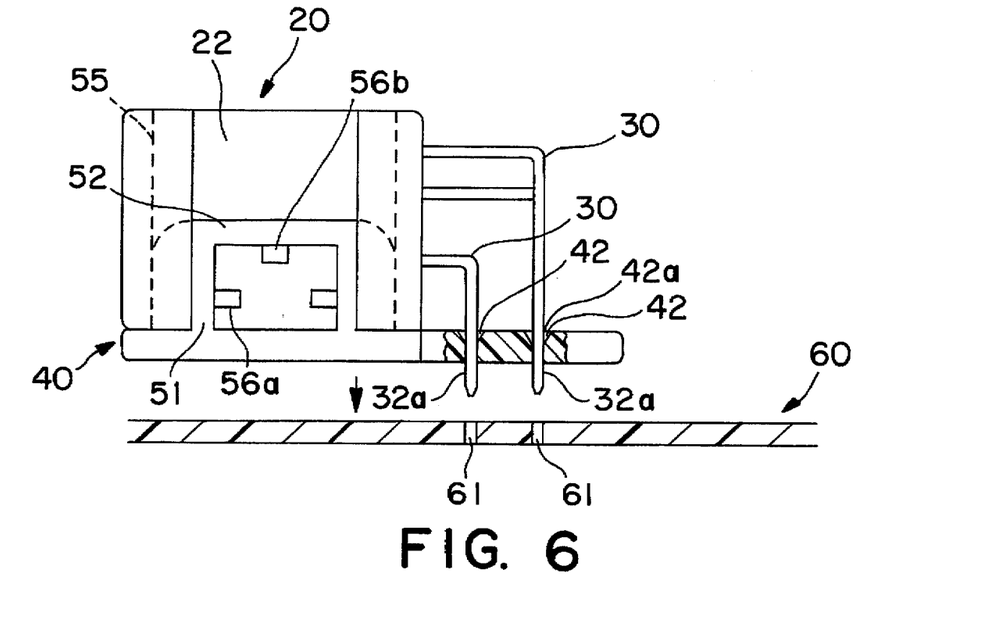
FIG. 6 is an end view of the connector of FIG. 5.

The height of the cross-section of projection 56b is considerably larger than the distance between the partially mounted position m and the bottom surface n of positioning member 40. Thus, as shown in FIGS. 5 and 6, leading ends 32a of terminals 30 project from insertion holes 42 by a required predetermined length when engaging portions 52 of engaging members 51 move over projections 56b and are locked thereby. In other words, distance d of projection 56b is such that positioning member 40 is retained in its locked position and leading ends 32a extend beyond holes 42 for insertion into receiving holes 61 of circuit board 60.

Further, in housing 20, a pair of vertically extending guide grooves 55 is formed at the front and rear sides of each guide surface 22. The space between guide grooves 55 is substantially equal to the space between supports 53. By fitting supports 53 into the pairs of guide grooves 55, positioning member 40 is allowed to slide vertically without being displaced in the forward, backward, or lateral directions.

The thickness of guide grooves 55 in the lateral direction, normal to guide surfaces 22, is equal to the sum of the thickness of engaging member 51 and the projecting distance of projections 56. Accordingly, engaging portions 52 are allowed to flex outward as they move over projections 56. The displacement of positioning member 40 in the lateral direction (widthwise of guide grooves 55) with respect to housing 20 can be prevented by the contact of engaging members 51 with guide surfaces 22.

To assemble connector 10, as shown in FIGS. 1 and 2, positioning member 40 is disposed below housing 20 and moved upward after engaging members 51 are fitted into guide grooves 55. As positioning member 40 moves upward, engaging portions 52 move over partially mounted projections 56a while undergoing an outward elastic deformation, and are locked between projections 56a and 56b after returning to their positions in contact with guide surfaces 22 due to their resilience. In this way, positioning member 40 is held in its partially mounted position, and leading ends 32a of terminals 30 of housing 20 are inserted a short distance into insertion holes 42.

While bringing positioning member 40 to its partially mounted position, leading ends 32a of terminals 30 are inserted straight into insertion holes 42 if leading ends 32a are in conformity with the centers of insertion holes 42. On the other hand, if the centers of leading ends 32a of lead terminals 30 are displaced from the centers of insertion holes 42, leading ends 32a come into contact with inclined surfaces 42a at the upper ends of insertion holes 42. Leading ends 32a are guided toward the centers of insertion holes 42 along the slope of inclined surfaces 42 and consequently guided therein.

As described above, in connector 10 according to this embodiment, leading ends 32a of the displaced terminals 30 can be smoothly guided into insertion holes 42 by inclined surfaces 42a adjacent insertion holes 42. Therefore, positioning member 40 can be smoothly mounted on housing 20, thereby improving workability.

Connector 10 is transported in the partially mounted position so that, if it is struck or subjected to an external force, leading ends 32a of terminals 30 are protected by positioning member 40. Therefore, leading ends 32a are not bent during transportation. Since connector 10 according to this embodiment does not require a special package or the like for preventing damage to leading ends 32a, transportation costs can be reduced. After transportation, when connector 10 is connected to a circuit board, positioning member 40 is moved to its locked position as shown in FIGS. 5 and 6.

More specifically, when positioning member 40 is moved upward until engaging portions 52 of engaging members 51 move over projections 56b while undergoing outward elastic deformation, engaging portions 52 return to contact guide surfaces 22 due to their resilience. As a result, engaging portions 52 are held by projections 56b. In this way, positioning member 40 is retained in its locked position. Connector 10 is conveyed to circuit board 60, and leading ends 32a projecting from the lower surface of the positioning member 40 are inserted into receiving holes 61. Connector 10 can be electrically connected to circuit board 60 by means of soldering, if desired. Since projecting ends 32a of terminals 30 are aligned during the connection of connector 10 with circuit board 60, they can be easily inserted into holes 61.

While engaging portions 52 of engaging members 51 move over projections 56a and 56b when positioning member 40 engages housing 20 and when connector 10 is connected to circuit board 60, engaging members 51 undergo elastic deformation whereby they incline outward in guide grooves 55. This causes positioning member 40—and its rear portion 41—to undergo some elastic deformation. This deformation of positioning member 40 results in a slight misalignment of insertion holes 42.

However, in connector 10, engaging members 51 are located at the outside of guide surfaces 22 on opposite lateral side walls of housing 20. Accordingly, in comparison with positioning member 3 of the prior art connector (in which engaging members 7 are located on the inside of guide walls 5), the spacing between engaging members 51 of positioning member 40 is longer than the spacing between engaging members 7 of prior art positioning member 3 even if the lateral dimension of housing 20 is equal to that of prior art housing 1. This is true because the spacing between engaging members 51 would be longer than the spacing between prior art engaging members 7 by the thickness of the side walls.

Accordingly, if it is assumed that engaging members 51 are deformed to the same degree as prior art engaging members 7, the deformation per unit length of positioning member 40 according to the Invention is less than that of the prior art. Thus, misalignment of insertion holes 42 caused by deformation of positioning member 40 is reduced as compared to that of the prior art. As a result, leading ends 32a of terminals 30 can be aligned with greater accuracy.

Figure 7:
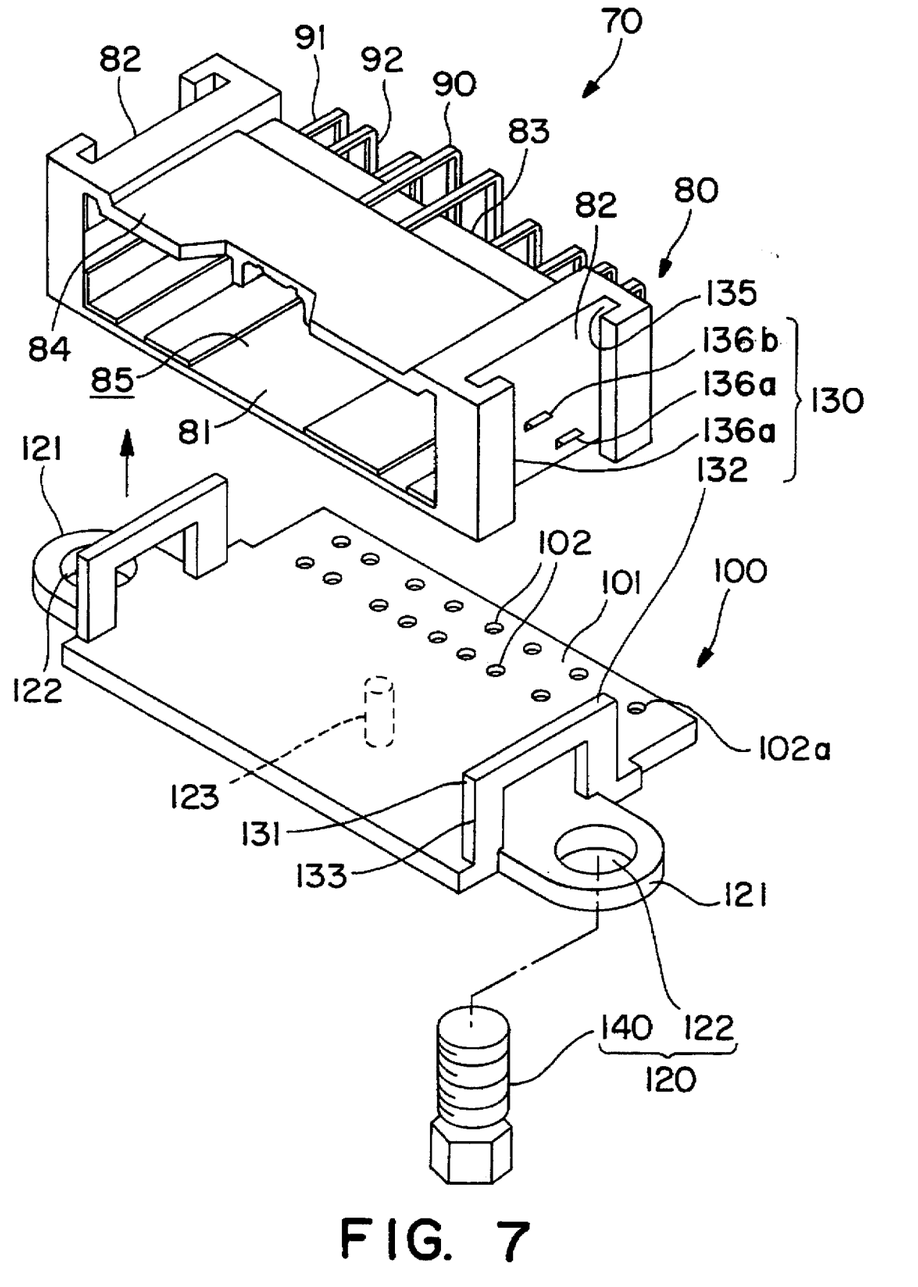
FIG. 7 is an exploded perspective view of a second embodiment of the connector of the present Invention.
Figure 8:
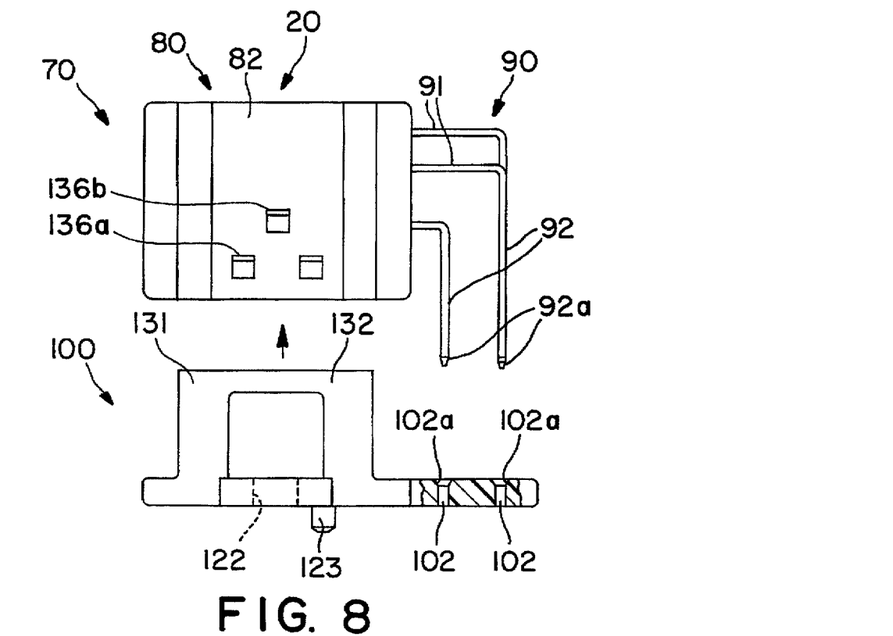
FIG. 8 is an exploded end view of the connector of FIG. 7.

In FIGS. 7 and 8, a second embodiment of the Invention is shown. Connector 70 includes housing 80, terminals 90, projecting from the rear surface of housing 80, and positioning member 100, which is detachably mountable on housing 80 and has a plurality of insertion holes 102 into which a plurality of terminals 90 is insertable. Housing 80 is preferably unitarily formed of an insulating material into a box-like shape similar to housing 20 of the first embodiment, and has bottom 81, opposite side walls, rear wall 83, and top 84. Engaging opening 85, into which an unillustrated male connector is mounted, is located at the front part of housing 80.

The side walls of housing 80 are parallel to each other, and the outer surfaces thereof act as guide surfaces 82. Engaging members 131 of positioning member 100 are brought into contact with guide surfaces 82 and held thereat by their opposite lateral ends, with the result that positioning member 100 is permitted to make a parallel movement without being displaced in the lateral direction.

The plurality of terminals 90 on housing 80 is similar to terminals 30 of the first embodiment. In other words, each terminal 90 is formed by bending a conductive wire into an L-shape, and includes horizontal portion 91 secured on rear wall 83 and vertical portion 92 having leading end 92a facing downward.

Positioning member 100 has substantially the same construction as positioning member 40 of the first embodiment. In other words, positioning member 100 is formed of a substantially rectangular flat insulating plate of an elastically deformable synthetic resin. Narrow rear portion 101, with a number of insertion holes 102 corresponding to the number of terminals 90, is at the rear of positioning member 100. Insertion holes 102 are in register with leading ends 92a of terminals 90. At the upper end of each insertion hole 102 into which one leading end 92a is inserted, there is formed inclined surface 102a.

Positioning member 100 is mounted on housing 80 by a pair of engaging members 131, each including engaging portion 132 and two supports 133. A pair of guide grooves 135, two partially mounted projections 136a, and locking projection 136b are on each guide surface 82 of housing 80. Projections 136a and projection 136b are spaced apart by the width of engaging portion 132. Spacing D (see FIG. 10) is greater than the distance between partially mounted position M and bottom N of positioning member 100. Engaging portions 132 and projections 136 form retainer 130 for keeping positioning member 100 in its partially mounted and locked position on housing 80.

The space between the inner surfaces of engaging members 131 is equal to the space between guide surfaces 82 of housing 80. In other words, the inner surfaces of engaging members 131 can be brought into contact with corresponding guide surfaces 82. The width of guide grooves 135 is such that engaging portions 132 are allowed to move over projections 136 while being deflected outward.

Figure 14:
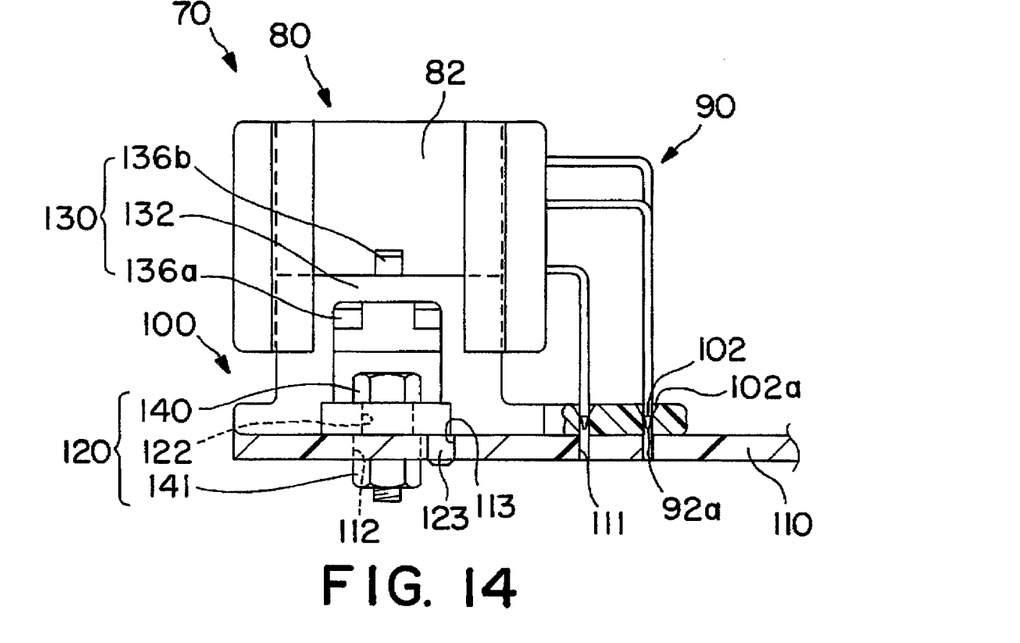
FIG. 14 is an end view of the connector of FIGS. 7, 9 and 11 mounted on the circuit board with the positioning member in its partially mounted position.
Figure 15:
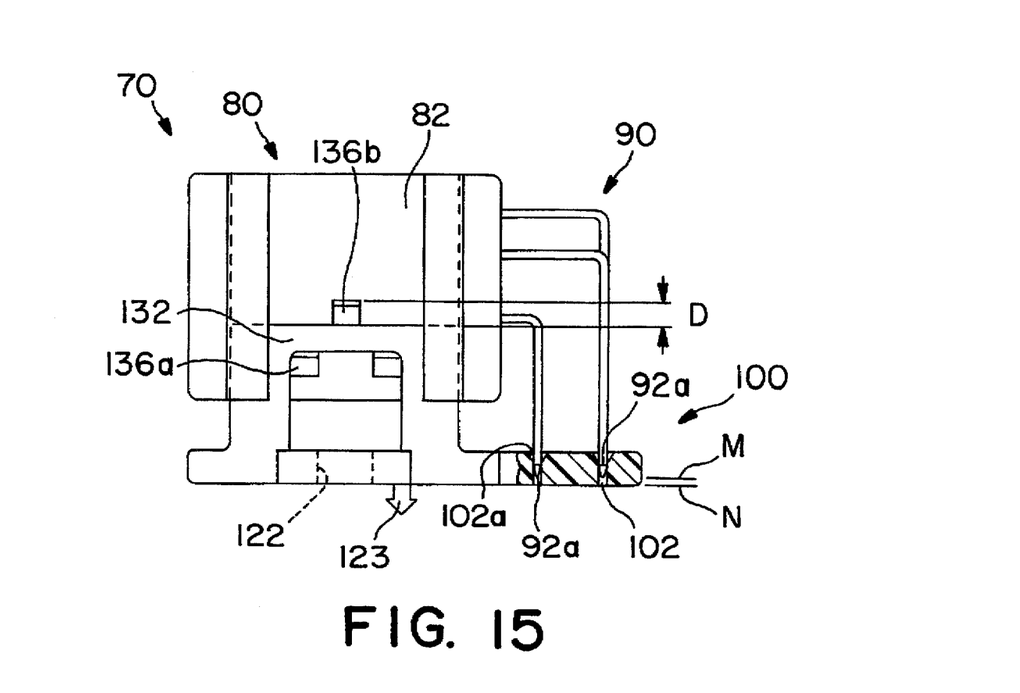
FIG. 15 is an end view of another embodiment of the inventive connector.

Positioning member 100 of the second embodiment is further provided with guide projection 123, preferably in a substantially central position on the bottom of positioning member 100. Guide projection 123 projects and is adapted to locate leading ends 92a of terminals 90 in conformity with specified through holes 111 of circuit board 110 when connector 70 is connected to circuit board 110 (see FIG. 14). Circuit board 110 has engaging hole 113 into which guide projection 123 of positioning member 100 is closely fitted.

Wing portions 121 extend from opposite lateral ends of positioning member 100, and has the same thickness. Each wing portion 121 carries circular guide hole 122. Screws 140 and guide holes 122 together form securing device 120. Circuit board 110 has positioning holes 112 which are concentric with and conform to guide holes 122.

Screws 140 are inserted through positioning holes 112, and their threaded portions, projecting from positioning holes 112, engage guide holes 122. With guide projection 123 fitted into engaging hole 113, guide holes 122 conform to positioning holes 112, and insertion holes 102 of positioning member 100 are in register with through holes 111 of circuit board 110.

Figure 9:
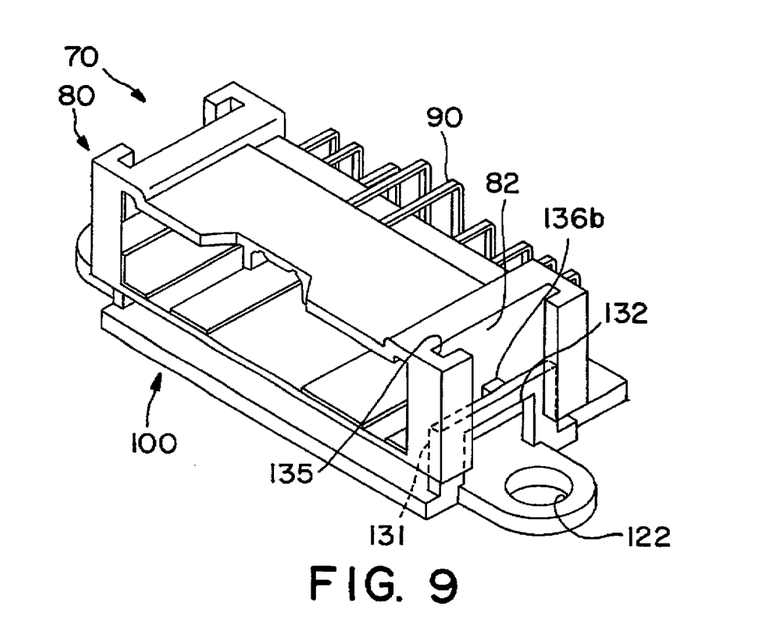
FIG. 9 is a perspective view of the connector of FIG. 7 in its partially mounted position.
Figure 10:
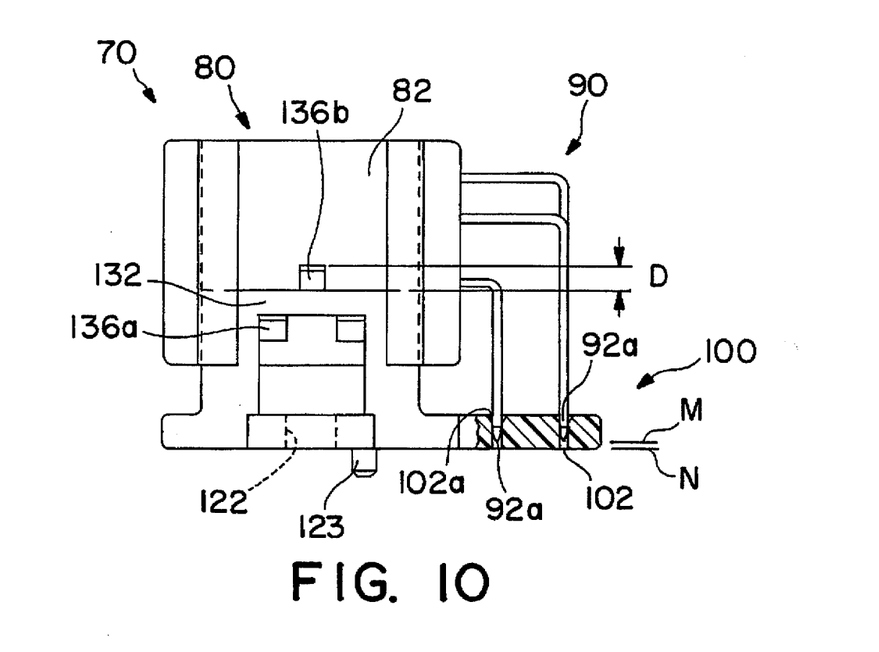
FIG. 10 is a end view of the connector of FIG. 9.
Figure 11:
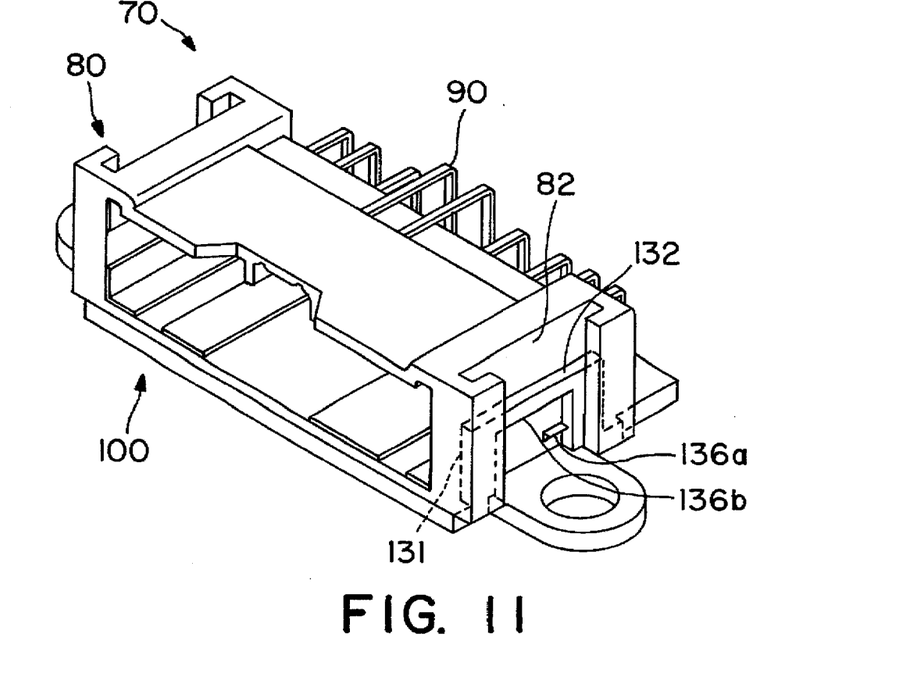
FIG. 11 is a perspective view of the connector of FIGS. 7 and 9 in its locked position.
Figure 12:
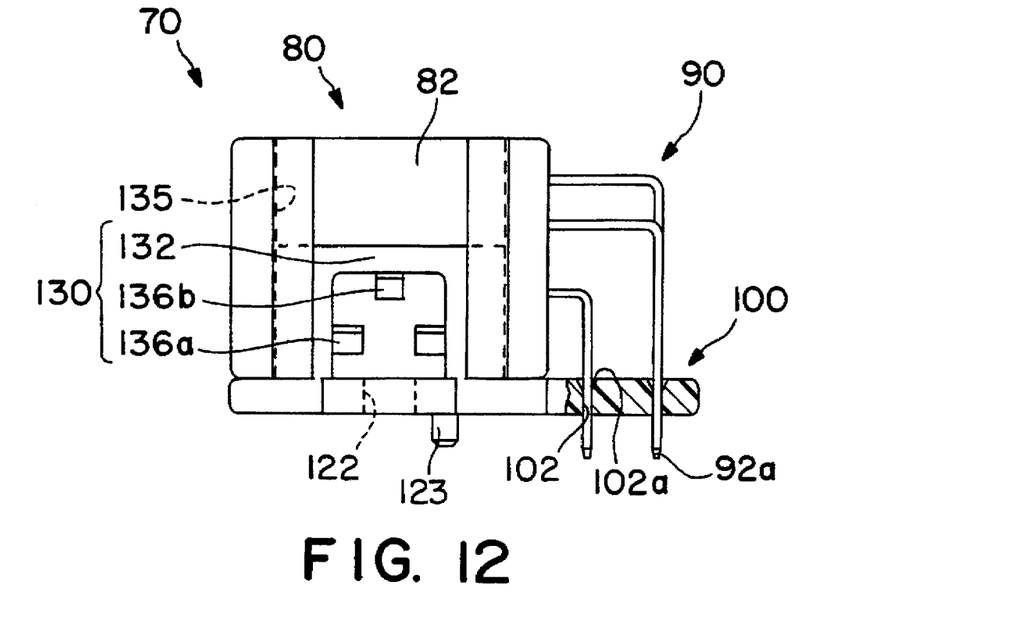
FIG. 12 is an end view of the connector of FIG. 11.

To assemble this embodiment, positioning member 100 is disposed below housing 80 as shown in FIGS. 7 and 8. Positioning member 100 is moved upward after engaging portions 131 are fitted in guide grooves 135 in contact with guide surfaces 82. Then, as shown in FIGS. 9 and 10, engaging portions 132 move over partially mounted projections 136a while undergoing outward elastic deformation, and positioning member 100 is thereby mounted on housing 80 so that engaging members 132 are locked between projections 136a and projection 136b. In this way, positioning member 100 is retained in its partially mounted position where leading ends 92a of terminals 90 of housing 80 are inserted into insertion holes 102 by distance M.

If connector 10 is transported with positioning member 10 in its partially mounted position as shown in FIG. 10, leading ends 92a are not bent during transportation, even if connector 70 is struck and is therefore subjected to an external force. This is because they are protected by positioning member 100. Since connector 70 does not require a special package or the like for preventing damage to leading ends 92a during transportation, transportation costs can be reduced.

After transportation, when connector 70 is connected to circuit board 110, positioning member 100 is moved until engaging portions 132 of engaging members 131 are locked after passing over locked projections 136b while undergoing outward elastic deformation. In this way, positioning member 100 is retained in its locked position. As a result, leading ends 92a of lead terminals 90 are aligned, and project from the bottom of positioning member 100 through insertion holes 102 by the desired length.

Figure 13:
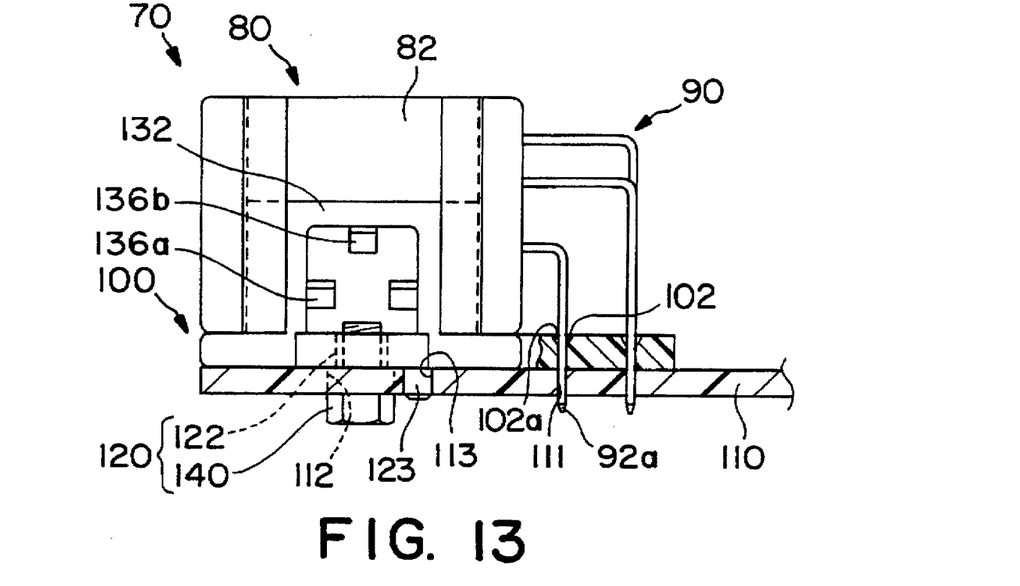
FIG. 13 is an end view of the connector of FIGS. 7, 9 and 11 mounted on a circuit board.

After connector 70 is placed on circuit board 110, screws 140 are inserted into positioning holes 112 from beneath, and the threaded portions on the leading ends of screws 140 engage guide holes 122. As screws 140 are turned, connector 70 is gradually pulled closer to circuit board 110, and leading ends 92a of terminals 90 projecting from positioning member 100 are inserted into through holes 111, as shown in FIG. 13.

At this stage, guide projection 123 of positioning member 100 is located in engaging hole 113 of printed circuit board 110, thereby positioning leading ends 92a of terminal 90 in register with through holes 111. Since positioning member 100 gradually comes closer to circuit board 110 as screws 140 are turned, this positioning can be more easily performed. Although screws 140 are threadedly engageable with positioning member 100 in this embodiment, they may be alternatively engageable with housing 80 so that housing 80 comes closer to circuit board 110 as screws 140 are turned. With this arrangement, pressing housing 80 against positioning member 100 and fixing connector 70 to circuit board 110 can be simultaneously performed by tightening screws 140 after connector 70 is placed on circuit board 110 with positioning member 100 in its partially mounted position on housing 80.

As is clear from the above description, when connector 70 is connected to circuit board 110, terminals 90 are positioned in conformity with through holes 111 without being brought into contact with the surface of circuit board 110. Therefore, the connector 70 can be easily and securely connected.

Further, since connector 70 and circuit board 110 are securely brought into close contact with each other by screws 140 and guide holes 122, leading ends 92a of terminals 90 can be deeply inserted into through holes 111 of circuit board 110, thereby achieving a secure connection. The foregoing description refers to the case in which connector 70 is connected to circuit board 110 after positioning member 100 is in its locked position.

However, the connection can also be made differently. Positioning member 100, held in its partially mounted position as shown in FIG. 10, is fixed on printed circuit board 110 while being oriented by guide projection 123 (see FIG. 14). Thereafter, housing 80 is pressed downward toward circuit board 110 to insert leading ends 92a of terminals 90 into through holes 111, thereby achieving the locked position as shown in FIG. 13. The advantage of this sequence of operations is that lead terminals 90 are protected by positioning member 100 at all times until they are inserted into holes 111.

Similar to the first embodiment, engaging members 131 are located at the outside of the side walls of housing 80 in connector 70. Accordingly, the deformation per unit length of positioning member 100, which is caused by the elastic deformation of engaging members 131 when engaging portions 132 move over projections 136, is minimized. Therefore, the opportunities for misalignment of insertion holes 102 caused by elastic deformation are also reduced or virtually eliminated. This permits leading ends 92a of terminals 90 to be aligned with greater accuracy than heretofore.

While only a specific number of embodiments of the present Invention have been expressly disclosed, such modifications as would suggest themselves to the person of ordinary skill may be made without departing from the scope thereof.

Although, in the second embodiment, guide projection 123 and screw 120 are provided, either one of them may be omitted. If only guide projection 123 is provided, the connector can be securely positioned in the specified position on the printed circuit board. The terminals are inserted into the through holes without being brought into contact with the surface of the printed circuit board.

On the other hand, if only the screw is provided, the connector can be mounted on the printed circuit board in close contact therewith, the terminals can be inserted into the through holes to a sufficient depth. Further, by setting the inner diameter of the holes through which the screws are inserted very close to the outer diameter of the screws, they can also perform the positioning function. Although, in the second embodiment, holes 122 of wing portions 121 are part of the retainer, a combination of screws and nuts may be substituted therefor.

In the foregoing embodiments, the projections are formed on the guide surfaces of the housing and the engaging portions of the engaging members move over these projections; however, this arrangement may be modified. Projections could be located on both the guide surfaces and the engaging members, and the positioning member retained by contact between the projections on the engaging members and those on the guide surfaces. Alternatively, recesses and complementary projections could be placed on the guide surfaces and the engaging members, and the positioning member retained by entry of the projections into the recesses.

The foregoing or other changes may be made in the Invention without going beyond the spirit thereof. It is, therefore, to be broadly construed and not to be limited except by the character of the claims appended hereto.

What we claim is:

1. A connector comprising a housing, a plurality of terminals extending in an inserting direction therefrom and substantially parallel to each other, a positioning member having a plurality of insertion holes corresponding to said terminals and adapted to receive said terminals in said inserting direction, at least one guide surface on said housing substantially parallel to said insertion direction and facing outwardly in a lateral direction perpendicular to said insertion direction, said positioning member comprising at least one engaging member, adapted to contact said guide surface, resiliently outwardly deformable in said lateral direction, and adapted to be guided by said guide surface from a detached position, wherein said positioning member is spaced apart from said housing, to a partially mounted position, wherein said positioning means is attached to said housing and leading ends of said terminals extend into but not through said insertion holes, to a locked position, wherein said leading ends extend through said insertion holes and project out of said holes in said insertion direction, said housing having a pair of guide grooves spaced apart in a guide direction perpendicular to said lateral direction and parallel to said inserting direction, said guide grooves facing each other and extending parallel to said inserting direction, said guide grooves having a width in said lateral direction at least equal to a corresponding dimension of said engaging member, said engaging member adapted to slide in said guide grooves.

2. The connector of claim 1 wherein there are two guide surfaces, spaced apart from and substantially parallel to, each other, said positioning member comprising two engaging members, said terminals being between said guide surfaces and said insertion holes being between said engaging members.

3. The connector of claim 1 wherein said guide surface is provided with a retainer, said engaging member being adapted to be retained by said retainer in at least one of said partially mounted position and said locked position.

4. The connector of claim 2 wherein each of said guide faces is provided with a retainer and each of said engaging members is adapted to be retained by said retainer in at least one of said partially mounted position and said locked position.

5. The connector of claim 3 wherein said retainer comprises at least one partial projection adapted to engage said engaging member in said partially mounted position.

6. The connector of claim 4 wherein each said retainer comprises at least one partial projection adapted to engage one of said engaging members in said partially mounted position.

7. The connector of claim 3 wherein said retainer comprises a locking projection adapted to engage said engaging member in said locked position.

8. The connector of claim 4 wherein each said retainer comprises a locking projection adapted to engage one said engaging member in said locked position.

9. The connector of claim 6 wherein there are two partial projections on each of said guide faces, said partial projections being at a height from a bottom of said housing.

10. The connector of claim 9 wherein each said locking projection has a length in said inserting direction, said length exceeding a distance between said leading ends, when said positioning member is in its partially mounted position, and a bottom of said positioning member.

11. The connector of claim 10 wherein a vertical distance between upper faces of said partially mounted projections and a lower face of said locking projection is substantially equal to a vertical thickness of said engaging member.

12. The connector of claim 1 comprising a retainer, said engaging member being adapted to be retained by said retainer in at least one of said partially mounted position and said locked position, said retainer including at least one partial projection or a locking projection, said partially mounted projection or said locking projection protruding a projecting distance from said guide face, said width of said guide grooves being at least as large as said projecting distance plus said corresponding dimension, whereby said engaging member is adapted to slide in said guide grooves and pass over said partially mounted projection or said locking projection while in said guide grooves.

13. The connector of claim 1 which is adapted to be fixed to a circuit board by a screw.

14. The connector of claim 13 wherein said screw is inserted from beneath said circuit board and threadedly engages at least one of said positioning member and said housing.

15. The connector of claim 14 wherein said screw fits closely within said circuit board and said positioning member or said housing whereby said screw acts to locate said positioning member relative to said housing.

16. The connector of claim 1 comprising a tapered area surrounding each of said insertion holes and having an inclined surface slanting to each of said insertion holes.

17. A connector comprising a housing, a plurality of terminals extending in an inserting direction therefrom and substantially parallel to each other, a positioning member having a plurality of insertion holes corresponding to said terminals and adapted to receive said terminals in said insertion direction, at least one guide surface on said housing substantially parallel to said insertion direction and facing outwardly in a lateral direction perpendicular to said insertion direction, said positioning member comprising at least one engaging member, adapted to contact said guide surface, resiliently outwardly deformable in said lateral direction, and adapted to be guided by said guide surface from a detached position, wherein said positioning member is spaced apart from said housing, to a partially mounted position, wherein said positioning means is attached to said housing and leading ends of said terminals extend into but not through said insertion holes, to a locked position, wherein said leading ends extend through said insertion holes and project out of said holes in said insertion direction, a positioning element is provided on said positioning member to locate said positioning member relative to a circuit board;

said positioning element constituting a positioning projection extending toward said circuit board and entering a positioning opening therein.

18. The connector of claim 17 wherein said positioning element comprises a device which retains said positioning element in said opening.

* * * * *